United States Patent
Abe

(10) Patent No.: US 6,972,526 B2
(45) Date of Patent: Dec. 6, 2005

(54) ORGANIC EL DISPLAY DEVICE AND DRIVING CIRCUITS

(75) Inventor: Shinichi Abe, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 10/444,999

(22) Filed: May 27, 2003

(65) Prior Publication Data

US 2003/0223275 A1 Dec. 4, 2003

(30) Foreign Application Priority Data

May 28, 2002 (JP) ........................ 2002-153501

(51) Int. Cl.⁷ .............................................. G09G 3/10
(52) U.S. Cl. ................... 315/169.3; 345/76; 345/212; 315/291
(58) Field of Search ................... 315/160, 167, 315/169.2, 169.3, 291–292, 307; 345/211, 212, 76–77

(56) References Cited

U.S. PATENT DOCUMENTS

| 6,586,888 B2 | 7/2003 | Kitahara et al. | ......... 315/169.1 |
|---|---|---|---|
| 6,753,654 B2 * | 6/2004 | Koyama | ............... 315/169.1 |
| 2002/0047550 A1 * | 4/2002 | Tanada | ................... 315/155 |
| 2002/0145581 A1 * | 10/2002 | Kudo et al. | ............... 345/89 |
| 2002/0180369 A1 * | 12/2002 | Koyama | ............... 315/169.1 |
| 2003/0011314 A1 * | 1/2003 | Numao | ................... 315/169.3 |

FOREIGN PATENT DOCUMENTS

| JP | 63-280568 | 11/1988 |
|---|---|---|
| JP | 10-112391 | 4/1998 |
| JP | 2003-234655 | 8/2003 |
| JP | 2003-295828 | 10/2003 |

* cited by examiner

Primary Examiner—Thuy Vinh Tran
(74) Attorney, Agent, or Firm—Mattingly, Stanger & Malur, P.C.

(57) ABSTRACT

A drive current of every terminal pin is regulated according to data stored in a rewritable non-volatile memory by ON/OFF switching the data by a switch circuit. By writing data necessary for luminance regulation for correcting luminance variation or luminance unevenness in the non-volatile memory, luminance variation or luminance unevenness is reduced.

14 Claims, 4 Drawing Sheets

ORGANIC EL DISPLAY DEVICE AND DRIVING CIRCUITS

BACKGROUND OF THE INVENTION

1. Field of the Invention

The present invention relates to a drive current regulator circuit, an organic EL element drive circuit using the drive current regulator circuit and an organic EL display device using the organic EL element drive circuit and, in particular, the present invention relates to an organic EL display device, which can reduce luminance variation or luminance unevenness of a display screen of a portable telephone set, a PHS, etc., can improve a fabrication efficiency thereof and is suitable to provide a high luminance color display.

2. Description of the Prior Art

It has been known that an organic EL display device, which realizes a high luminance display by spontaneous light emission, is suitable for a display on a small display screen and the organic EL display device has been attracting public attention as the next generation display device to be mounted on a portable telephone set, a PHS, a DVD player or a PDA (Personal Digital Assistants), etc. Known problems of such organic EL display device are that, since, when it is driven by voltage as in a liquid crystal display device, luminance variation thereof becomes substantial and that, since there is difference in sensitivity of organic EL element between R (red), G (green) and B (blue), a control of luminance of a color display becomes difficult.

In view of these problems, an organic EL display device using current drive circuits has been proposed recently. For example, JPH10-112391A discloses a technique in which the luminance variation problem is solved by employing a current drive system.

An organic EL display panel of an organic EL display device for a portable telephone set, a PHS, etc., having 396 (=132×3) terminal pins for column lines and 162 terminal pins for row lines has been proposed. However, there is a tendency that the number of column lines as well as row lines is further increased.

An output stage of a current drive circuit of such organic EL display panel of either the active matrix type or the passive matrix type includes a current source drive circuit, such as an output circuit constructed with a current mirror circuit, for each of the terminal pins. A drive stage of the current drive circuit includes a parallel-drive type current mirror circuit (reference current distribution circuit) having a plurality of output side transistors for each of the terminal pins as disclosed in Japanese Application JP2002-82662 (domestic priority application claiming priorities of Japanese Application JP2001-86967 and Japanese Application JP2001-396219) corresponding to U.S. patent application Ser. No. 10/102,671. In the disclosed drive stage, a plurality of mirror currents for driving the output circuits are generated correspondingly to the respective terminal pins on the basis of a reference current supplied from a reference current generator circuit and supplied to the respective pins. Alternatively, the mirror currents supplied to the respective terminal pins are amplified by respective k-time current amplifier circuits, where k is an integer equal to or larger than 2, and the output circuits are driven with the amplified currents. The k-time amplifier circuit is disclosed in JP2002-33719, in which D/A converter circuits are provided correspondingly to the respective terminal pins and each D/A converter circuit converts display data corresponding to the column side terminal pins into analog data to generate a column side drive current simultaneously.

It is general, in the organic EL display device, that one of the column side (anode side) lines becomes the current discharge side and the row side (cathode side) lines becomes the current sink side. Drive currents from the column side current drive circuits are supplied to the anode side of the organic EL elements. Therefore, the drive current on the column side (anode side of the EL element) influences the display luminance directly.

In JP2002-82662, a drive current is regulated by regulating a reference current from a reference current generator circuit with using a laser-trimming type drive current regulator circuit in a fabrication step.

FIG. 4 is a circuit diagram showing a drive stage of a column line current drive circuit disclosed in JP2002-82662. The column line current drive circuit 20 includes a reference current inverting circuit 21, a laser-trimming type drive current regulator circuit 22, a drive current generator circuit (corresponding to the drive current distributing circuit) 23, a plurality (n) of k-time drive current generator circuits 82 and a plurality of current mirror output circuits 83 having a plurality (n) of N-time output terminals 84. Incidentally, a reference numeral 91 depicts a 4-bit D/A converter provided in a stage preceding to the drive stage and having data input terminals D1~D4.

For one column driver IC, the drive current generator circuit 23 for distributing the reference current to terminal pins includes an input side transistor Qa and a plurality (n) of output side transistors Qn (n≧30), which are current-mirror connected to the transistor Qa. Output currents of the transistors Qn are transferred to the n k-time drive current generator circuits 82 provided corresponding to the respective transistors Qn. The respective drive currents are amplified k×N times through the n k-time drive current generator circuits 82 and the n N-time output current-mirror output circuits 83 and outputted to n output terminal pins 84 of the column lines. Incidentally, in JP2002-82662, the input side transistor Qa is arranged at a center of the n output side transistors Qn (n≧30).

The n k-time drive current generator circuits 82 are controlled by a switching controller circuit 92 to generate peak currents for driving organic EL elements and to set display data, etc.

Incidentally, in FIG. 4, a reference numeral 4 depicts a 15V power source, 7 a 3V power source connected to a power source line +VDD and 5 a controller.

A transistor Q1 and a transistor Q2 are an input side and an output side transistors of a current mirror circuit, respectively, and a transistor Q3 and transistors Q4 and Q5 are an input side transistor and output transistors of a current mirror circuit, respectively. Further, a transistor Q6 and a transistor Q7 are an input transistor and an output transistor of a current mirror circuit, respectively. An emitter of the transistor Q6 is connected to a series circuit of resistors Rb1~Rbn and an emitter of the transistor Q7 is connected to a series circuit of resistors Rc1~Rcn. Fuses Hb1~Hbn and Hc1~Hcn for laser-trimming are connected in parallel to the respective series circuits and are selectively cut away in a fabrication step of IC by laser beam. By this selective cutting of the fuses, the drive current mI (collector current of the transistor Q7) generated by the drive current regulator circuit 22 is regulated.

The drive current of the input side transistor Qa of the drive current distribution circuit 23 constructed with a current mirror circuit having a single input side transistor and a plurality (n) of output side transistors is regulated by this drive current regulator circuit 22. Thus, the luminance variation of every product is restricted by regulating the drive current of each output transistor.

Particularly, in JP2002-82662, luminance variation of products as well as luminance unevenness of every product is restricted by arranging the single input side transistor at the center of the n output transistors and regulating the luminance difference between R, G and B of every product.

However, when the number (n) of the output side transistors of the current mirror circuit having the single input transistor is increased, a current of the output side transistor in the center position becomes substantially different from that of one of the output transistors positioned opposite sides. Since such current difference is amplified by the k-time drive current generator circuits 82 and the n N-time current mirror output circuits 84, etc., the terminal pin drive currents in the last output stage become much different depending upon the positions of the terminal pins. Therefore, the difference between drive currents causes luminance variation or luminance unevenness.

In order to reduce such luminance difference depending upon the positions of output terminal pins, it may be considered to regulate the drive currents individually by providing drive current regulator circuits correspondingly to the respective output terminal pins. In such case, the number of locations at which regulation by laser-trimming is performed in a test stage of the consignment of the products becomes very large, causing throughput of the fabrication of product to be degraded. Further, the circuit size of the product becomes large necessarily.

SUMMARY OF THE INVENTION

An object of the present invention is to provide a drive current regulator circuit of an organic EL element drive circuit which is capable of reducing luminance variation or luminance unevenness of a display screen of a portable telephone set or a PHS, etc., and of improving a fabrication efficiency thereof.

Another object of the present invention is to provide an organic EL element drive circuit which is capable of reducing luminance variation or luminance unevenness of a display screen of a portable telephone set or a PHS, etc., and of improving a fabrication efficiency thereof.

A further object of the present invention is to provide an organic EL display device, which is capable of reducing luminance variation or luminance unevenness of a display screen of a portable telephone set or a PHS, etc., and of improving a fabrication efficiency thereof.

In order to achieve these objects, the present invention is featured by that a drive current regulator circuit of an organic EL element drive circuit, for regulating a drive current of every terminal pin of an organic EL display panel comprises a switch circuit for selectively passing data stored in a memory and a current generator circuit provided for every terminal pin, for generating a current having a predetermined current value on a basis of a current for driving the terminal pin or a basic current of the drive current and an ON/OFF operation of the switch circuit, wherein the memory is a non-volatile memory written with data or a volatile memory written with data written in a non-volatile memory and is adapted to regulate the drive current according to the predetermined current.

In the present invention, it is possible to regulate drive currents of the respective terminal pins correspondingly to data supplied from a rewritable non-volatile memory according to ON/OFF operation of the switch circuit. Therefore, it is possible to reduce luminance variation or luminance unevenness by writing data required for a luminance regulation for correcting luminance variation or luminance unevenness in the non-volatile memory.

For example, it is possible to easily regulate luminance in a test stage of the consignment of the products by merely writing a predetermined data in the non-volatile memory according to luminance unevenness on a display screen of a display panel assembled as a product or luminance variation of products, even when the number of locations, which are to be trimmed in the test stage of consignment of the products, becomes very large.

As a result, it is possible to improve throughput of the product fabrication, reduce luminance variation or luminance unevenness of every device such as portable telephone set or PHS, etc., and improve the fabrication efficiency.

DETAILED DESCRIPTION OF THE PREFERRED EMBODIMENTS

Figure 1:
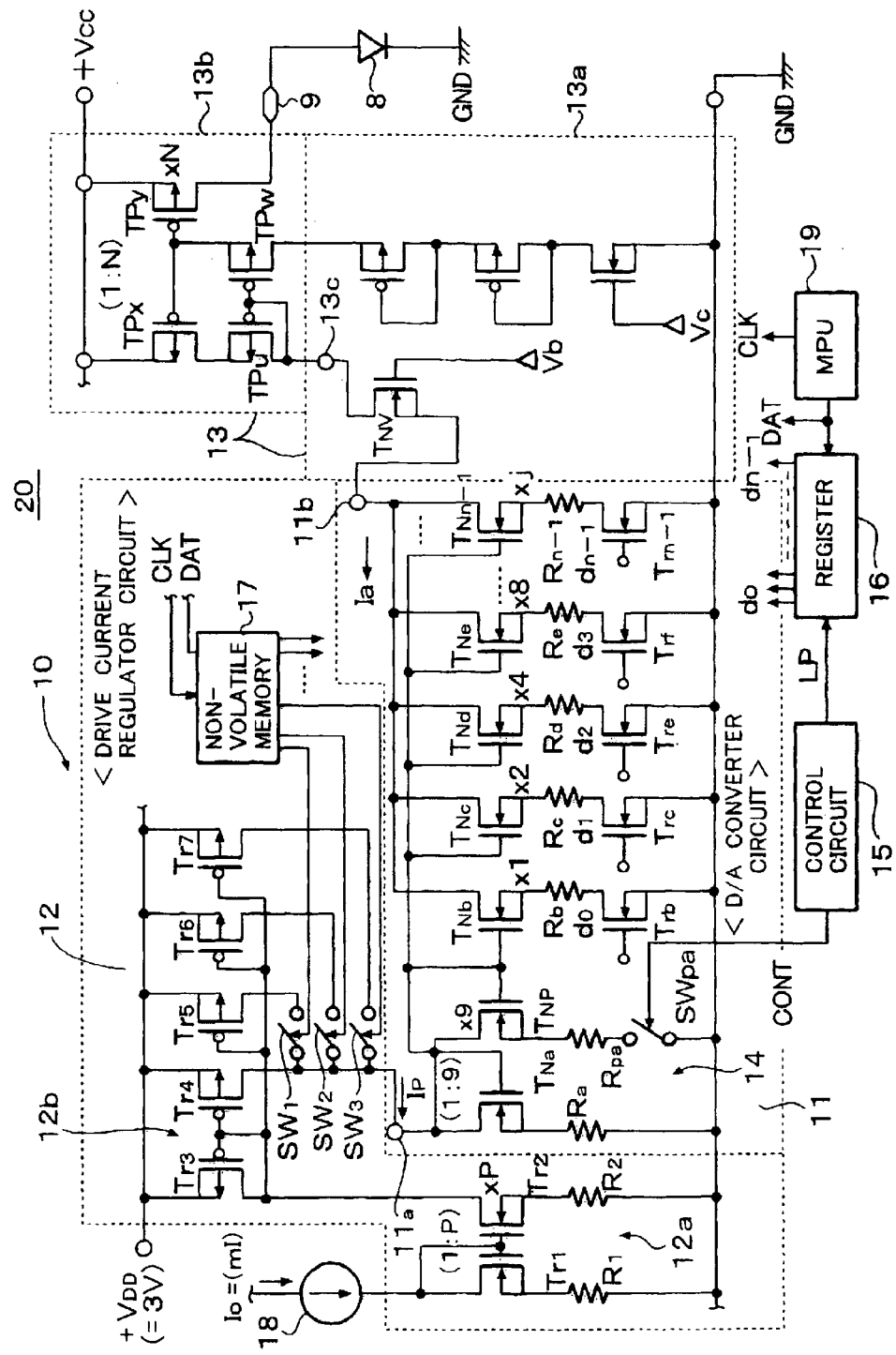
FIG. 1 is a block circuit diagram of a column driver of an organic EL element drive circuit according to an embodiment of the present invention.

FIG. 1 is a block circuit diagram of a column driver 20 of an organic EL element drive circuit, according to an embodiment of the present invention. In FIG. 1, the column driver 20 corresponds to a combination of the k-time drive current generator circuits 82 and the n current mirror output circuits 83 for outputting the N-time outputs, shown in FIG. 4, and is provided for every terminal pin of the organic EL display panel.

Figure 4:
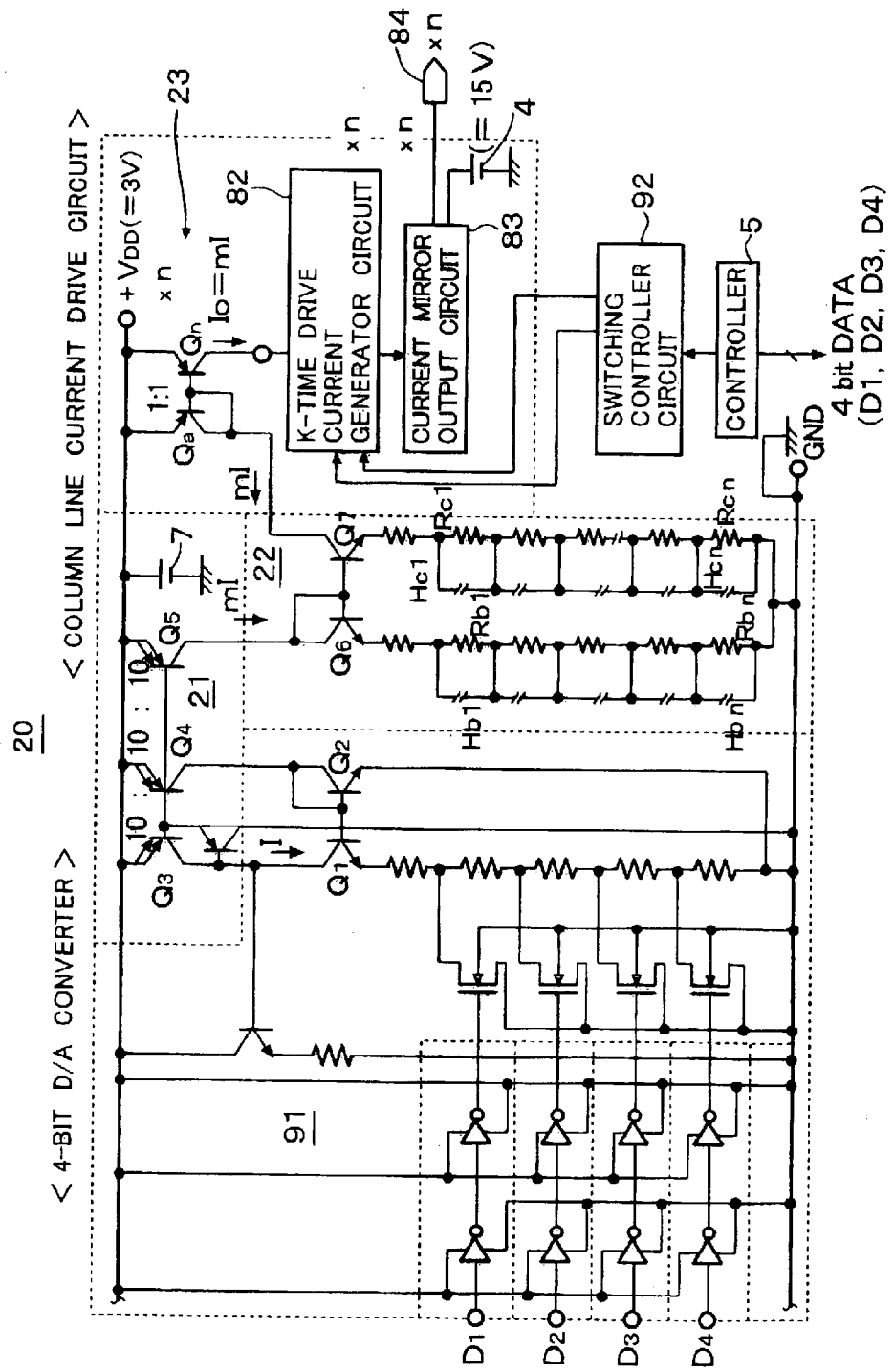
FIG. 4 is a block diagram of a drive stage of a conventional column line current drive circuit.

A circuit depicted by a reference numeral 10 corresponds to a combination of the k-time drive current generator circuit 82 shown in FIG. 4 having a D/A converter circuit 11 and generates a drive current corresponding to a display data. A reference numeral 12 depicts a drive current regulator circuit, 13 a current-mirror type current output circuit, 14 a peak current generator circuit, 15 a control circuit, 16 a register, 17 a non-volatile memory and 18 a constant current source. The constant current source 18 outputs a output current (Io=mI) corresponding to the output current of the transistor Qn provided for every terminal pin of the drive current distribution circuit 23 shown in FIG. 4.

The D/A converter circuit 11 includes an N channel input side transistor TNa and an N channel input side transistor TNp connected in parallel to the transistor TNa. N channel output side transistors TNb~TNn are current-mirror connected to these input side transistors TNa and TNp.

Channel width (gate width) ratio of the transistor TNa to the transistor TNp is set to 1:9. A source of the trasistor TNa is grounded through a resistor Ra and a source of the transistor TNp is grounded through a resistor Rpa and a switch circuit SWpa.

Incidentally, the ratio of channel width (gate width) of 1:9 may be realized by connecting, in parallel, nine (9) MOS transistors, which have good paring characteristics with respect to the one MOS transistor.

The input side transistors TNa and TNp are connected to an input terminal 11a and supplied with a regulated current Ip from the drive current regulator circuit 12 through the input terminal 11a.

The drive current regulator circuit 12 is supplied with the current Io (=mI) from the constant current source 18 and supplies the regulated current Ip corresponding to a terminal pin to the input side current-mirror transistor TNa through the input terminal 11a of the D/A converter circuit 11. In an initial portion of a period for which the switch circuit SWpa is in OFF state, a peak current Ipa is generated at an output terminal 11b of the D/A converter circuit 11 as an output current Ia corresponding to the display data. When the switch circuit SWpa is turned ON thereafter, the drive current Ip is branched and flows in the input side transistors TNa and TNp. In this case, a normal state drive current Ia, which is one-tenth of the peak current Ipa is generated at the output terminal 11b.

Resistors Rb~Rn-1 are inserted between sources of the output side transistors TNb~TNn-1 and drains of transistors Trb~Trn-1, respectively. Therefore, it is possible to improve the preciseness of current paring of the D/A converter circuit 11.

Incidentally, gates of the transistors Trb~Trn-1 are connected to input terminals do~dn-1 to which the j-bit display data is inputted from the register 16. Sources of the transistors Trb~Trn-1 are grounded.

The current-mirror type current output circuit 13 corresponds to the current-mirror type current output circuit 83 shown in FIG. 4 and includes a drive level shift circuit 13a and an output current-mirror circuit 13b.

The drive current regulator circuit 12 includes a current-mirror drive circuit 12a composed of N channel MOS transistors Tr1 and Tr2, a current-mirror type regulator circuit 12b composed of P channel transistors Tr3~Tr7 driven by the current-mirror type drive circuit 12a and the non-volatile memory 17.

A drain of the input side transistor Tr1 of the current-mirror type drive circuit 12a is connected to the constant current source 18 and supplied with the current Io (=mI) therefrom. A source of this transistor is grounded through a resistor R1. Ratio of channel width (gate width) of the output side transistor Tr2 of the current mirror drive circuit 12a to that of the transistor Tr1 thereof is set to P (P is an integer equal to or larger than 2) and a drain of the transistor Tr2 is connected to a drain of the input side transistor Tr3 of the current mirror regulator circuit 12b and a source of the transistor Tr2 is grounded through a resistor R2.

Therefore, a current P×Io flows in the output side transistor Tr2 and the transistor Tr3 is driven by this current. As a result, a mirror current of P×Io is outputted from the output side transistor Tr4.

Sources of the current-mirror connected transistors Tr3~Tr7 are connected to the power source line +VDD and a drain of the output side transistor Tr4 is connected to the input terminal 11a of the D/A converter circuit 11. Drains of the output side transistors Tr5~Tr7 are connected to the drain of the transistor Tr4 through respective switch circuits SW1~SW3 such that the output side transistors Tr5~Tr7 are connected in parallel to the transistor Tr4. The transistors Tr5~Tr7 constitute a current correction circuit for correcting the mirror current P×Io outputted from the output side transistor Tr4.

For example, required preciseness of current on the output side of the D/A converter circuit 11, which is represented by 1 LSB (resolution) in a 6-bit tone, is 1 $\mu$A or less. In order to satisfy such requirement, ratios of channel width (gate width) of the transistors Tr5~Tr7 to that of the transistor Tr3 are set to, for example, 1/10, 1/20 and 1/40.

It becomes possible to regulate the drive current of the D/A converter circuit 11 by adding currents P×Io/10, P×Io/20 and/or P×Io/40 to the current P×Io by turning the switches SW1~SW3 ON selectively or as a whole. Since the drive current thus regulated is amplified and outputted through the D/A converter circuit 11 to the current-mirror type current output circuit 13 as the drive current of the terminal pin, the terminal pin drive current can be regulated by the drive current regulator circuit 12. Incidentally, the current P×Io before regulation is set to a lower limit of a variation of the drive current or in the vicinity of the lower limit (for example, 3 $\sigma$). With this setting, it is possible to properly determine the drive currents to be supplied to the terminal pins.

The selection of the switch circuits SW1~SW3 to be ON/OFF controlled is performed according to 3-bit data stored in a predetermined region of the non-volatile memory 17. For example, when the 3-bit data is "010", the switch circuit SW2 corresponding to bit "1" is turned ON and the switch circuits SW1 and SW3 each corresponding to bit "0" are turned OFF.

The data stored in the non-volatile memory 17 is set by a MPU 19. Incidentally, the non-volatile memory 17 has a memory capacity of 3×n bits (where n is a total number of terminal pins of column lines of one driver IC) or more and a 3-bit region is assigned for every terminal pin.

The MPU 19 generates a 3-bit data for luminance regulation of every terminal pin and stores 3×n bits in the non-volatile memory 17. The 3-bit data is supplied to the non-volatile memory 17 according to clock CLK as the data DAT. Thus, it is possible to perform the luminance regulation for pixels in a horizontal scan direction.

Incidentally, the 3-bit data for every terminal pin is generated as a mean value of luminance of pixels of the display screen measured in a vertical scan direction of the respective terminal pins, resulting in data DAT of totally 3n bits. In this case, 3-bit data of terminal pin, for which luminance regulation is unnecessary, is "000". It is practical that the 3-bit data is generated for every terminal pin, which requires luminance regulation.

Further, it is possible to perform the luminance regulation for all pixels of the display screen in a horizontal scan and a vertical scan. In this case, the MPU 19 generates a 3-bit data for luminance regulation of every terminal pin depending upon the positions of the vertical scan line and stores 3×n×S bits in the non-volatile memory 17, where S is a number of the vertical scan lines.

Such luminance regulation may be possible by monitoring a display screen of an assembled product and generating the data DAT for pixels having different luminance. The thus generated 3n-bit data may be written by the MPU 19 in the test stage of the consignment of the products. In this manner, the luminance unevenness on a display screen of the product or the luminance variation of display screens of the products can be regulated.

FRAM, MRAM or EEPROM, etc., may be used as the non-volatile memory 17. Further, although three switch circuits SW1~SW3 are provided in this embodiment, the number of switch circuits is not limited thereto and may be 1 or larger than 3. Therefore, the data for regulating luminance may have at least one bit.

Now, the current-mirror type current output circuit 13 will be described.

The drive level shifter circuit 13a is used for transmitting the output of the D/A converter circuit 11 to the output stage current-mirror circuit 13b and is constructed with an N channel MOS FET TNv. A gate of the MOS FET TNv is connected to a bias line Vb and a source thereof is connected to the output terminal 11b of the D/A converter circuit 11. A drain of the MOS FET TNv is connected to the input terminal 13c of the output stage current-mirror circuit 13b.

Thus, it is possible to generate a drive current Ia at the input terminal 13c according to the output current Ia of the D/A converter circuit 11, which corresponds to the display data.

The output stage current-mirror circuit 13b includes P channel MOS FETs TPu and TPw and P channel MOS FETs TPx and TPy. Gate width ratio of the transistor TPx to the transistor TPy of the output stage current-mirror circuit 13b is 1:N. Sources of the transistors TPx and TPy are connected to the power source line +Vcc of about +15V, which is higher than the voltage of the power source line VDD. The output side transistor TPy is connected to the column side output terminal pin 9 and, in a drive period, supplies a drive current N×Ia thereto. An organic EL element 8 is connected between the output terminal pin 9 and the ground GND. Incidentally, Vc in FIG. 1 depicts a bias line.

The input side transistor TNp, a resistor Rpa and the switch circuit SWpa constitute the peak current generator circuit 14 and the switch circuit SWpa is kept OFF for a constant time tp in an initial drive period and, after the constant time, is turned ON by a control signal CONT from the control circuit 15.

At the start time of the drive, the switch circuit SWpa is not supplied with the control signal CONT from the control circuit 15. Therefore, a current Ip flows in the input side transistor TNa and a current, which is Ip×M where M corresponds to data set in one of input terminals do~dn−1, is generated, resulting in the peak current Ipa=M×Ip at the output terminal 11b of the D/A converter circuit 11. After the peak current generation period tp, the control signal CONT is generated to turn the switch circuit SWpa ON. Therefore, the current in the input side transistor TNa is branched to the input side transistor TNp. Since the gate width ratio of these transistors is 1:9, a current Ip/10 flows in the input side transistor TNa and a current 9 ×Ip/10 flows in the input side transistor TNp. As a result, the input side drive current of the current mirror circuit becomes substantially 1/10 and the current Ia (=Ipa/10) is generated at the output terminal 11b of the D/A converter circuit 11.

Incidentally, since it is enough to initially charging the organic EL element 4 having capacitive load characteristics by the peak current, a start time point of the peak current period tp is not always necessary to be coincident with the start time of the drive.

Figure 2:
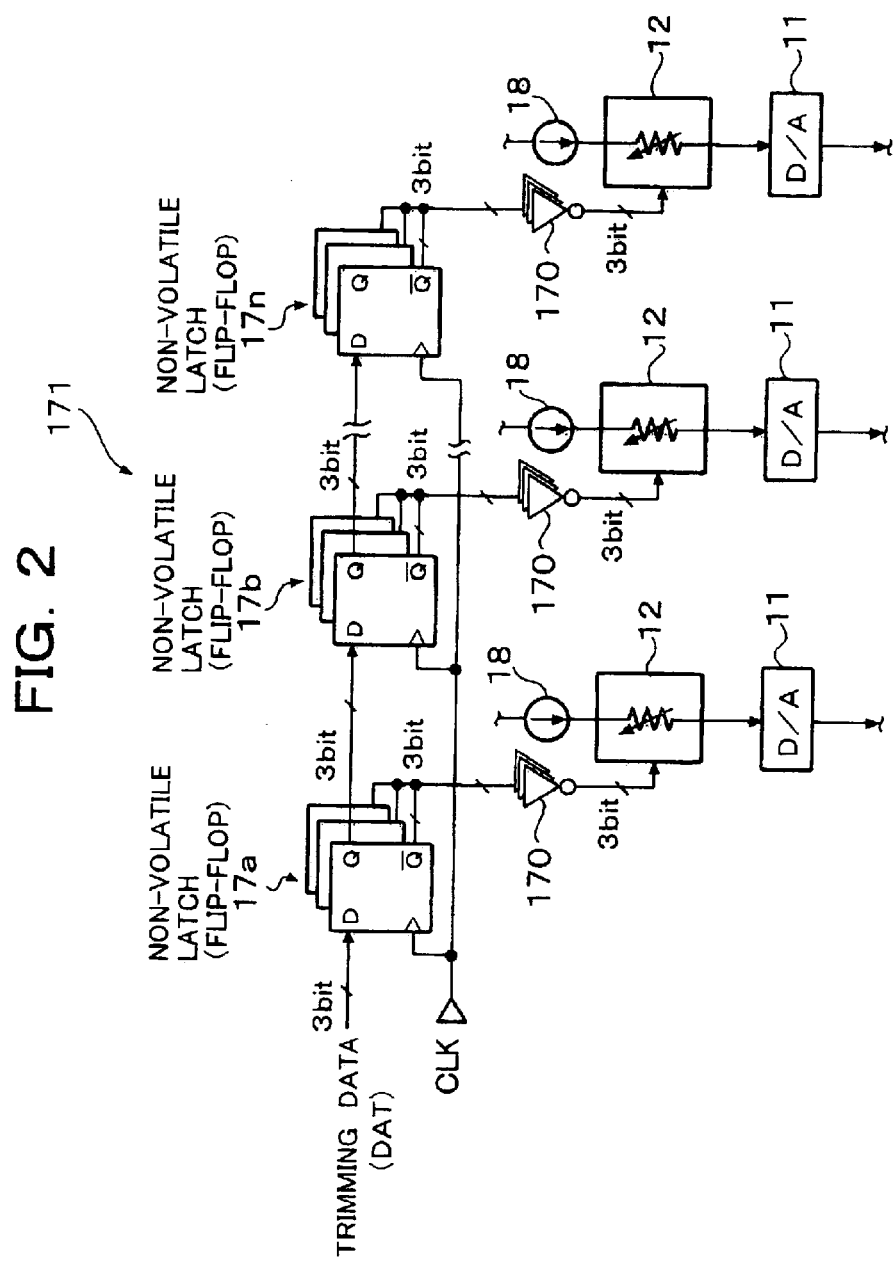
FIG. 2 is a circuit diagram of a non-volatile memory constructed with a shift register.

FIG. 2 shows a concrete example of the non-volatile memory 17 having a shift register construction.

A reference numeral 171 depicts parallel-connected, three shift registers each including n stages. Each stage includes a series connection of n flip-flops 17a to 17n provided correspondingly to the respective n output terminal pins 9 as non-volatile latches. By the parallel connection of three non-volatile latches in each stage, each stage becomes a 3-bit non-volatile memory.

Each 3-bit data of the data DAT (trimming data) of 3×n bits for luminance regulation, which is inputted to the flip-flop 17a, is serially shifted to the respective stages according to the clock CLK from the MPU 19 and stored in the flip-flops 17a~17n as luminance regulation data.

Inverted outputs Q (over bar) of the three flip-flops in each stage are outputted to the switch circuits SW1~SW3 of the drive current regulator circuit 12 corresponding to the respective terminal pins through inverters 170 to selectively turn the switch circuits ON/OFF in order to regulate the luminance of every terminal pin so that the luminance unevenness or the luminance variation on the display panel of every product is reduced.

Figure 3:
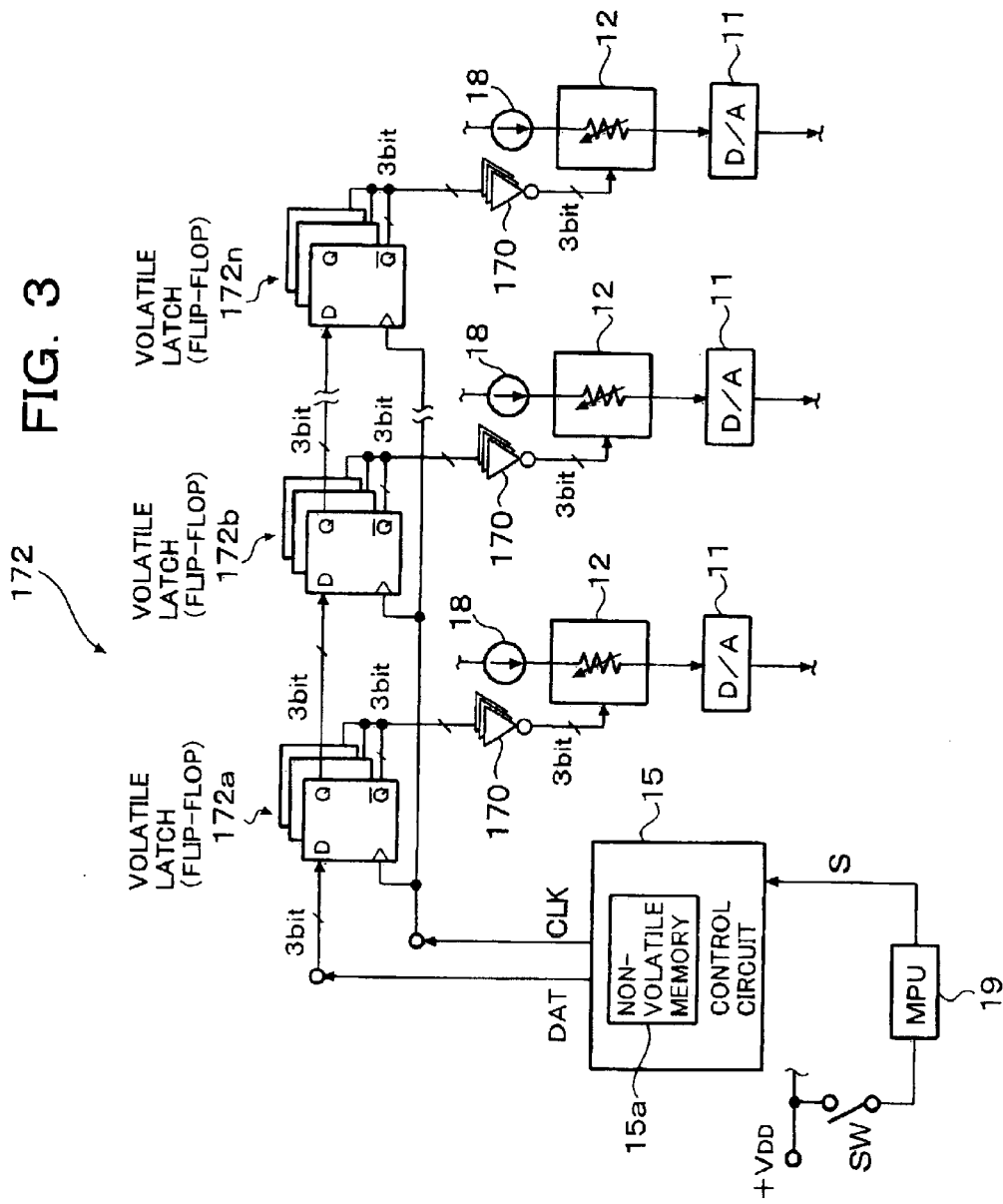
FIG. 3 is a circuit diagram of the non-volatile memory shown in FIG. 2, which is constructed with a shift register composed of volatile memories.

FIG. 3 shows a shift register 172, which is another embodiment of the present invention. The shift register 172 is constructed with volatile memories.

The shift register 172 shown in FIG. 3 includes parallel-connected three shift registers each including n stages as in the case shown in FIG. 2. However, each stage includes a series connection of n flip-flops 172a to 172n provided correspondingly to the respective n output terminal pins 9 as volatile latches for latching data.

The data DAT (trimming data) of 3×n bits for luminance regulation is inputted serially to the flip-flops 172a from the control circuit 15. Simultaneously therewith, the flip-flops 172a~172n store the luminance regulation data according to a clock CLK from the control circuit 15.

The trimming data DAT is stored in a non-volatile memory 15a provided in the control circuit 15. An MPU 19 generates a control signal S when a power source switch SW is turned ON. Upon the control signal S from the MPU 19, the control circuit 15 generates the clock signal CLK and the trimming data DAT and writes the trimming data in the shift register 172.

The trimming data DAT is written in the non-volatile memory 15a by the MPU 19 according to data externally inputted to the MPU 19 through a keyboard, etc.

In this case, the control circuit 15 may be the MPU 19 as in the case shown in FIG. 2. The volatile memory for storing the luminance regulation data is not limited to such shift register. It may be such as RAM, etc.

Incidentally, in the organic EL display device, the column side current drive circuit outputs a drive current according to the row side scan as mentioned previously. Therefore, it is practical that the organic EL element 8 is grounded through the row line scan circuit although the EL element 8 shown in FIG. 1 is connected between the output terminal pin 9 and ground GND.

As described hereinbefore, the number of the switch circuits SW1~SW3 may be any. If a single switch circuit is used, only one bit data is necessary for ON/OFF controlling the switch circuit.

Since this embodiment includes the drive current regulator circuit 12, the conventional laser trimming drive current regulator circuit 22 may be removed. When the drive current regulator circuit 22 is not removed, it is used not to regulate drive currents for respective terminal pins but to regulate the reference current totally. Further, it is possible to provide a laser trimming drive current regulator circuit separately in the present invention. Since, according to the present invention, the luminance regulation for respective terminal pins can be a total luminance regulation covering the R, G and B, the reference current regulator circuit for totally covering the R, G and B may be used together with the reference current regulator circuit of the present invention. It is of course possible to use the drive current regulator circuit 12 for individual luminance regulation of the respective R, G and B as well as total luminance regulation covering the R, G and B.

Further, the drive current regulator circuit 12 may be proA drive current regulator circuit of an organic EL element drive circuit, as claimed in claim 1, wherein said memory is a volatile memory written with data transferred from a non-volatile memory provided externally of said drive current regulator circuit. vided at any position between the reference current generator circuit (in the input stage or initial stage) for generating the reference current and the output stage for current-driving the terminal pins of the organic EL panel, provided that the drive current for every output terminal pin flows in the position. Similarly, the D/A converter circuit supplied with the display data may be arranged between the input stage (or initial stage) and the output stage.

Since a current drive circuit for monochromatic display may be used as the current drive circuit of the present invention, it is not necessary to provide the current drive circuits correspondingly to the respective R, G and B.

Although this embodiment is constructed with MOS FETs mainly, it can be constructed with using bipolar transistors. Further, in the described embodiment, the N channel (or npn) transistors may be replaced by P channel (or pnp) transistors or vice versa.

What is claimed is:

1. A drive current regulator circuit of an organic EL element drive circuit, for regulating a drive current of one of terminal pins of an organic EL display panel, comprising:

a switch circuit ON/OFF controlled according to data stored in a memory; and a current generator circuit provided for every one of said terminal pins and having a first current mirror circuit including an input side drive transistor and first and second output side transistors connected in current mirror to said input side drive transistor, said second output side transistor being connected in parallel to said first output side transistor through said switch circuit to generate a predetermined current at an output of said first output side transistor, said memory being a non-volatile memory written with said data or a volatile memory written with said data written in a non-volatile memory, said memory being adapted to regulate the drive current according to the predetermined current.

2. A drive current regulator circuit of an organic EL element drive circuit, as claimed in claim 1, further comprising an output stage current source for generating the drive currents of said terminal pins, wherein said first current mirror circuit is provided in a drive stage for driving said output stage current source.

3. A drive current regulator circuit of an organic EL element drive circuit, as claimed in claim 2, wherein a plurality of series circuits each including said second output side transistor and said switch circuit are connected in parallel to said first output side transistor, said non-volatile memory includes a plurality of shift registers each of which has a plurality of stages provided corresponding to a plurality of said terminal pins of said organic EL display panel, said stages corresponding to said switch circuits of said series circuits, respectively, outputs of said stages being supplied to said respective switch circuits.

4. A drive current regulator circuit of an organic EL element drive circuit, as claimed in claim 2, wherein a plurality of series circuits each including said second output side transistor and said switch circuit are connected in parallel to said first output side transistor, said memory being a volatile memory written with data written in a non-volatile memory or written with data transferred from a non-volatile memory provided externally of said drive current regulator circuit, the data is written in said non-volatile memory through a processor or a controller, said volatile memory includes a plurality of shift registers each of which has a plurality of stages provided correspondingly to a plurality of said terminal pins of said organic EL display panel, said stages corresponding to said switch circuits of said series circuits, respectively, outputs of said stages being supplied to said respective switch circuits.

5. An organic EL element drive circuit comprising a drive current regulator circuit as claimed in claim 2, wherein said drive stage includes a D/A converter circuit responsive to the data for generating a drive current for driving an output stage current source, said D/A converter circuit includes a second current mirror circuit, the predetermined current drives said input side transistor of said second current mirror circuit of said DIA converter circuit.

6. An organic EL element drive circuit as claimed in claim 5, wherein a plurality of input side transistors of said second current mirror circuit are connected in parallel to each other, a current value at, which the pin drive current becomes a peak, is generated at said output of said D/A converter circuit by the predetermined current in at least one of the plurality of said input side transistors and a current value at which the pin drive current becomes normal, is generated at said output of said D/A converter circuit by branching the predetermined current in said at least one input side transistor to at least another of the plurality of said input side transistors parallel to said at least one input side transistor.

7. A drive current regulator circuit of an organic EL element drive circuit, as claimed in claim 1, wherein said memory is a volatile memory written with data transferred from a non-volatile memory provided externally of said drive current regulator circuit.

8. An organic EL display device comprising:

an organic EL display panel;

an output stage for current-driving a plurality of terminal pins of said organic EL display panel; and a drive current regulator circuit of an organic EL element drive circuit for regulating a drive current for said terminal pins of said output stage, said drive current regulator circuit comprising a switch circuit ON/OFF controlled according to data stored in a memory and a current generator circuit provided for every one of said terminal pins of said organic EL display panel, and having a first current mirror circuit including an input side drive transistor and first and second output side transistors connected in current mirror to said input drive transistor, said second output side transistor being connected in parallel to said first output side transistor through said switch circuit to generate a predetermined current at an output of said first output side transistor, said memory being a non-volatile memory written with said data or a volatile memory written with said data written in a non-volatile memory, said memory being adapted to regulate the drive current according to the predetermined current.

9. An organic EL display device as claimed in claim 8, further comprising an output stage current source for generating the terminal pin drive current, wherein said current generator circuit is provided in a drive stage for driving said output stage current source.

10. An organic EL display device as claimed in claim 9, wherein a plurality of series circuits each including said second output side transistor and said switch circuit are connected in parallel to said first output side transistor, said non-volatile memory includes a plurality of shift registers each of which has a plurality of stages provided corresponding to a plurality of terminal pins of said organic EL display panel, said stages corresponding to said switch circuits of said series circuits, respectively, outputs of said stages being supplied to said respective switch circuits.

11. An organic EL display device as claimed in claim 9, wherein a plurality of series circuits each including said second output side transistor and said switch circuit are connected in parallel to said first output side transistor, said memory being a volatile memory written with data written in a non-volatile memory or written with data transferred from a non-volatile memory provided externally of said drive current regulator circuit, the data is written in said non-volatile memory through a processor or a controller, said volatile memory includes a plurality of shift registers each of which has a plurality of stages provided corresponding to a plurality of terminal pins of said organic EL display panel, said stages corresponding to said switch circuits of said series circuits, respectively, outputs of said stages being supplied to said respective switch circuits.

12. An organic EL display device as claimed in claim 9, wherein said drive stage comprises a D/A converter circuit responsive to a display data for generating a drive current for driving said output stage current source, said D/A converter circuit including a second current mirror circuit, the predetermined current driving an input side transistor of said second current mirror circuit of said D/A converter circuit.

13. An organic EL display device as claimed in claim 12, wherein a plurality of input side transistors of said second current mirror circuit are connected in parallel to each other, a current value at which the pin drive current becomes a peak, is generated at said output of said D/A converter circuit by the predetermined current in at least one of the plurality of said input side transistors and a current value at which the pin drive current becomes normal, is generated at said output of said D/A converter circuit by branching the predetermined current in said at least one input side transistOr to at least another of the plurality of said input side transistors parallel to said at least one input side transistor.

14. An organic EL display device as claimed in claim 8, wherein said memory is a volatile memory written with data transferred from a non-volatile memory provided externally of said drive current regulator circuit.

* * * * *